United States Patent
Strittmatter et al.

(10) Patent No.: US 8,330,144 B2
(45) Date of Patent: Dec. 11, 2012

(54) SEMI-POLAR NITRIDE-BASED LIGHT EMITTING STRUCTURE AND METHOD OF FORMING SAME

(75) Inventors: Andre Strittmatter, Berlin (DE); Noble M. Johnson, Menlo Park, CA (US); Mark Teepe, Menlo Park, CA (US); Christopher L. Chua, San Jose, CA (US); Zhihong Yang, Sunnyvale, CA (US); John E. Northrup, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/550,504

(22) Filed: Jul. 16, 2012

(65) Prior Publication Data

US 2012/0280212 A1    Nov. 8, 2012

Related U.S. Application Data

(62) Division of application No. 12/791,552, filed on Jun. 1, 2010, now Pat. No. 8,247,249.

(51) Int. Cl.
*H01L 21/00* (2006.01)

(52) U.S. Cl. . 257/28; 438/29; 257/E21.09; 257/E33.01; 257/E33.067

(58) Field of Classification Search ............. 257/28, 257/E21.909, E33.01, E33.067; 438/29
See application file for complete search history.

(56) References Cited

U.S. PATENT DOCUMENTS

| | | | |
|---|---|---|---|
| 7,687,293 B2 * | 3/2010 | Sato et al. | 438/46 |
| 8,022,427 B2 | 9/2011 | Miyake et al. | |
| 2008/0099785 A1 | 5/2008 | Bai et al. | |
| 2008/0283846 A1 | 11/2008 | Ohmae et al. | |
| 2008/0283866 A1 | 11/2008 | Takakura et al. | |
| 2011/0068347 A1 | 3/2011 | Strittmatter | |

OTHER PUBLICATIONS de Mierry, P. et al., "Improved semipolar (112-bar 2) GaN quality using asymmetric lateral epitaxy", Appl Phys Let, vol. 94, No. 191903 (2009).
Ni, X. et al., "Nonpolar m-plane GaN on patterned Si(112) substrates by metalorganic chemical vapor deposition", Appl Phys Let, vol. 95, No. 111102 (2009).
Ni, X. et al., "Epitaxial lateral overgrowth of (112-bar 2) semipolar GaN on (11-bar 00) m-plane sapphire by metalorganic chemical vapor deposition", Appl Phys Let, vol. 90, No. 182109 (2007).
Okuno, K. et al., "m-Plane GaN Films Grown on Patterned a-Plane Sapphire Substrates with 3-inch Diameter", App Phys Exp, vol. 2, 031002 (2009).
Gehrke, T. et al, "Pendeo-Epitaxy of Gallium Nitride and Aluminum Nitride Films and Heterostructures on Silicon Carbide Substrate", MRS Internet J. Semicond. Res. 4S1, G3.2 (1999).

(Continued)

*Primary Examiner* — Jami M Valentine
(74) *Attorney, Agent, or Firm* — Jonathan A. Small

(57) ABSTRACT

A structure and method for producing same provides a solid-state light emitting device with suppressed lattice defects in epitaxially formed nitride layers over a non-c-plane oriented (e.g., semi-polar) template or substrate. A dielectric layer with "window" openings or trenches provides significant suppression of all diagonally running defects during growth. Posts of appropriate height and spacing may further provide suppression of vertically running defects. A layer including gallium nitride is formed over the dielectric layer, and polished to provide a planar growth surface with desired roughness. A tri-layer indium gallium nitride active region is employed. For laser diode embodiments, a relatively thick aluminum gallium nitride cladding layer is provided over the gallium nitride layer.

7 Claims, 8 Drawing Sheets

OTHER PUBLICATIONS

Asamizu, H. et al., "Continuous-Wave Operation of InGaN/GaN Laser Diodes on Semipolar (112-bar 2) Plane Gallium Nitrides", Appl. Phys. Express, vol. 2, p. 21002 (2009).

Fellows, N. et al., "Increased Polarization Ratio on Semipolar (112-bar 2) InGaN/GaN Light-Emitting Diodes with Increasing Indium Composition", Jap. J. of Appl. Phys., vol. 47, No. 10, pp. 7854-7856 (2008).

Funato, M. et al., "Blue, Green, and Amber InGaN/GaN Light-Emitting Diodes on Semipolar {112-bar 2} GaN Bulk Substrates", Jap. J. of Appl. Phys., vol. 45, No. 26, pp. L659-L662 (2006).

Northrup, John E., "GaN and InGaN (112-sub-bar2) surfaces: Group-III adlayers and indium incorporation", Appl. Phys. Let., vol. 95, p. 133107 (2009).

* cited by examiner

SEMI-POLAR NITRIDE-BASED LIGHT EMITTING STRUCTURE AND METHOD OF FORMING SAME

CROSS-REFERENCE TO RELATED APPLICATIONS

The present application is a divisional application of copending U.S. application for Letters Patent Ser. No. 12/791,552, filed on Jun. 1, 2012, which is incorporated herein by reference and to which priority is claimed.

BACKGROUND

The present disclosure is related to the structure of a light emitting device such as a light emitting diode or laser diode, and more specifically to such devices formed over group III-nitride substrates such as semi-polar GaN($11\bar{2}2$) and non-polar GaN($10\bar{1}0$) substrates. A semi-polar surface orientation of a wurtzite material may be defined as an orientation (h, k, −(h+k), l) with h or k not equal to zero and l not equal to zero.

Producing light emitting structures such as light emitting diodes (LEDs) and semiconductor lasers on c-axis substrates is well known. $Al_2O_3(0001)$ (c-plane sapphire) is a common c-plane substrate used today. Due to the differences in lattice constants between the sapphire and material grown thereover, such as gallium nitride (GaN), vertical defects such as dislocations and stacking faults arise, which result in crystalline defects in the material grown over the substrate. Lateral overgrowth is one technique used to reduce the vertical dislocation defects.

While c-plane oriented substrates have been the most widely used substrates to date, other orientations such as semi-polar and m-plane orientations are becoming increasingly important. For example, bulk semi-polar GaN substrates are highly desired for indium-based light emitters such as light-emitting diodes (LEDs) and laser diodes (LDs), in order to reduce internal electric fields that impair the efficiency of the light emission process on conventional c-axis oriented nitride devices. However, such bulk substrates are not yet widely available and are limited to small sizes. As an alternative to bulk semi-polar GaN substrates, semi-polar GaN templates have been grown on large area sapphire substrates by conventional means such as Hydride Vapor Phase Epitaxy (HVPE). However, the defect density in such template layers is on the order of $10^{10}$ cm$^{-2}$, unless defect reduction techniques are applied.

While lateral overgrowth is an effective technique for c-plane oriented substrates, it is not optimized for materials in which the c-axis is tilted with respect to the surface normal, such as any semi-polar oriented GaN, in which a significant portion of defects extend across the GaN layer at an angle corresponding to the tilt of the basal plane GaN(0001). One difficulty observed is that since the lattice defects in a semi-polar template layer (or equivalently, a semi-polar substrate) run diagonally, e.g., at a given angle between 0 and 90 degrees relative to the plane of the growth surface, the effectiveness of a mask at limiting extension (or propagation) of the defects into the growth layer is reduced. To compound this problem, certain substrate orientations present defects in multiple different planes (e.g., perpendicular to the growth surface as well as angled relative to that plane). One technique used to address problems presented when using substrates with other than c-axis orientation is epitaxial lateral overgrowth (ELOG), and one variation on the ELOG process, referred to herein as windowed ELOG, is disclosed and discussed in detail in U.S. patent application Ser. No. 12/562,675, which is incorporated by reference herein and to which priority is hereby claimed. According to the windowed ELOG technique, a patterned mask with "window" openings is formed over the semi-polar layer. The windows have a vertical height at least equal to the product of the window width times the cotangent of the angle between the surface normal and the c-axis direction for the semi-polar layer. These windows effectively provide significant suppression of all diagonally running defects during growth of layers over the mask.

However, useful light emitting devices formed over relatively large semi-polar substrates has yet to be demonstrated. For example, typical light emitting structures such as laser diodes utilize a gallium nitride (GaN) template layer with a $Al_xGa_{1-x}N$/GaN short-period super-lattice (SPSL) lower (and upper) cladding layer. Such cladding layers are necessary to confine the optical wave to a region of high optical amplification and low loss due to absorption and scattering. The SPSL addresses the problem of strain-induced cracking that arises with thick AlGaN layers (of equal average composition).

However, the limited thickness, and limited Al-content in particular, of the lower cladding layer may lead to significant leakage of the optical mode into the underlying layer structure. In addition, when formed over the window ELOG base, a corrugated interface is produced as a result of the masking procedure and subsequent overgrowth. Such a corrugated interface results in highly undesired scattering losses. Perhaps most fundamentally, functional devices formed over the window ELOG base have not yet been demonstrated.

SUMMARY

Accordingly, the present disclosure is directed to a method and structure for forming useful light emitting devices which incorporate generally available non-c-plane oriented layers, such as a semi-polar oriented template layer or substrate. The present disclosure provides process for forming both laser diodes (LDs) and light emitting diodes (LEDs), capable of emitting in a range of wavelengths, such as in the blue portion of the visible spectrum.

According to one aspect of the disclosure relating to both LDs and LEDs, a window ELOG process forms a base structure. A core region, comprising n-type and p-type layers, an active region, and an electron-blocking layer (EBL), is formed thereover. The active region comprises a layered structure of indium-gallium-nitride, with layers of 0-5% indium surrounding a layer of 10-30% indium. That is, the region comprises a layer stack of $In_xGa_{1-x}N/In_yGa_{1-y}N/In_zGa_{1-z}N$, where $0 \leq x \leq 0.5$, $0.1 \leq y \leq 0.5$, and $0 \leq z \leq 0.5$.

According to one aspect of the disclosure relating to LDs, in addition to the above, a relatively thick AlGaN cladding layer is formed over the growth surface presented by the window ELOG base structure. In addition, an upper cladding, such as a known SPSL layer and upper p-type contact layer are formed over the upper layer of the core region.

According to still another aspect of the disclosure relating to both LDs and LEDs, the growth surface presented by the window ELOG layer is polished to a desired surface roughness.

According to still another aspect of the disclosure relating to both LDs and LEDs, voids are formed within the ELOG base structure during lateral overgrowth which are used for controlled substrate lift-off afterwards by chemical means.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that descriptions of well known starting materials, processing techniques, components, equipment and other well-known details are omitted so as not to unnecessarily obscure the details of the present invention. Thus, where details are otherwise well known, we leave it to the application of the present invention to suggest or dictate choices relating to those details.

Figure 1:
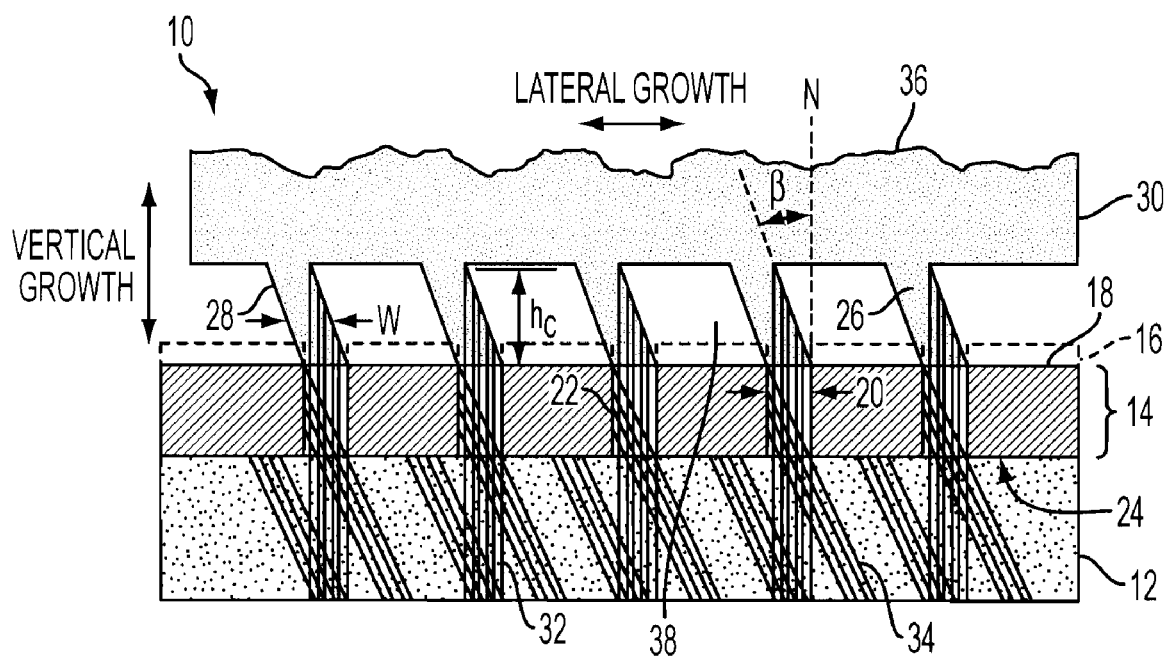
FIG. 1 is a cross-sectional view of a structure with lattice defect suppressing islands and inclined posts formed thereon according to one embodiment of the present disclosure.

With reference to FIG. 1, a first embodiment of a solid-state, edge-emitting laser diode (LD) 10 according to the present disclosure is shown and described as follows. Structure 10 comprises a template layer 12, which may be a 2 micro-meter (μm) thick or thicker GaN layer (or, alternatively, another nitride such as AlGaN, InGaN, combinations thereof, etc.) of semi-polar orientation (e.g., other than (0001) or (10$\bar{1}$0) oriented surface) grown by Hydride Vapor Phase Epitaxy (HVPE), metalorganic chemical vapor deposition (MOCVD), or any other suitable method, on Al$_2$O$_3$ (sapphire) of suitable orientation (for example, m-plane sapphire) or any other suitable substrate (not shown) of suitable orientation (for example, Si, SiC, AlN, ZnO etc.)

A dielectric layer 14, for example SiO$_2$ on the order of 2 μm thick, is deposited on template layer 12. A photoresist layer 16 is deposited, and is shown in dashed outline to represent that it is subsequently removed from the final structure. Photoresist layer 16 is patterned by conventional photolithography to form a regular pattern of openings, for example 1-μm wide stripes. The pitch of these stripes may be in a range of 10 to 20 μm, although other spacings are contemplated and depend on the application of the teachings of the present disclosure. A larger pitch (i.e., stripe separation) is beneficial for delaying coalescence, as discussed further below. The mask defines sidewalls predominantly in direction of the c-axis of the GaN unit cell. The vector that is normal to the sidewall surface forms an angle with the c-axis of the GaN that is determined by the orientation of growth surface 24.

For purposes of illustration, this embodiment 10 is described employing an "island" embodiment described in the aforementioned U.S. patent application Ser. No. 12/562,675, although a "trench" embodiment also described therein is equally useful. The SiO$_2$ layer 14 is mask-patterned, for example by reactive ion etching (RIE), thereby defining islands 18 and windows 20. Islands 18 define sidewalls 22. The sidewall surface planes intersect the growth surface planes at an angle very close to 90 degrees.

Selective surface cleaning is performed to remove the photoresist layer 16 while not attacking the SiO$_2$ layer 14. The structure is then positioned in a MOCVD growth chamber. In one embodiment, the growth chamber is a vertical quartz tube (not shown) with a rotating two-inch SiC-coated graphite susceptor. The susceptor body is heated by inductive heating, which is controlled via pyrometric temperature reading from the backside of the susceptor. Following transfer to the growth chamber, the substrate is heated to 1050° C. in an ammonia atmosphere and a layer growth (GaN, AlGaN) starts at a rate of 2 μm/h (for growth on a planar substrate) and a reactor pressure of 200 Torr using input flow rates of 6.7 μmol/min trimethylgallium, 4 slpm ammonia, and 6 slpm hydrogen. Growth proceeds in the GaN[11$\bar{2}$3] direction at a rate of about 1 μm/h, and greater than 5 μm/h in the GaN[11.0] direction. Thereby, predominant growth occurs in the GaN[1$\bar{1}$.0] direction, yielding posts 26 with side facets 28 inclined by, for example, 58 degrees with respect to the surface. The GaN layer growth may proceed until full coalescence of a layer 30 (coalescence layer) is achieved. That is, growth of posts 26 proceeds both horizontally and vertically (laterally) until the structure forms a connected body above posts 26.

The material grown over window ELOG regions will typically exhibit voids 38 beneath coalescence layer 30 (i.e., beneath the coalescence region). Such voids can be beneficial for LED structures as they may act as a light outcoupling enhancement structure, similar to a structure mechanically imprinted into the backside of some LED chips during processing of planar LED structures. Furthermore, these voids are thought to promote substrate removal by chemical agents (such potassium hydroxide KOH) as they provide channels for the chemicals and the amount of material to be removed is significantly reduced.

The important point of this process is that both vertically propagating dislocation defects 32 as well as inclined dislocation defects 34 are suppressed by the geometry and materials choice for layer 14 and coalescence layer 30. More specifically, vertically propagating dislocation defects 32 are suppressed by their incidence upon sidewalls 28 of columns 26, while inclined dislocation defects 34 are suppressed by their incidence upon sidewalls 22 of windows 20. It will be appreciated that due to this process, columns 26 must be tall enough to intersect with (and hence suppress) vertically propagating dislocations 32. This height, $h_c$, can be approximated as:

$$h_c = w/\tan \beta$$

where w is the width of a column, which is approximately the width of a window 20, and β is the angle that side facets 28 form with respect to the vertical direction (which is normal to surface 24).

Once full coalescence of layer 30 is achieved, growth stops and the structure may be removed from the growth chamber. The upper surface 36 of coalescence layer 30 will be rough, and will exhibit relative high and low points. Indeed, due to the geometry, growth over columns 26, there may be depressions or excursions in surface 36, which require polishing in order to render upper surface 36 planar. As much as 1000-3000 nm of material may be required to be removed in order to render upper surface 36 planar. A planar growth surface is important in order that subsequently grown layers have sharp and evenly distributed interfaces. Thus, as a next step in the process, upper surface 36 of coalescence layer 30 is polished, by methods known in the art, into a desired plane and to have a desired roughness, for example substantially less than 1 nm rms.

Figure 2:
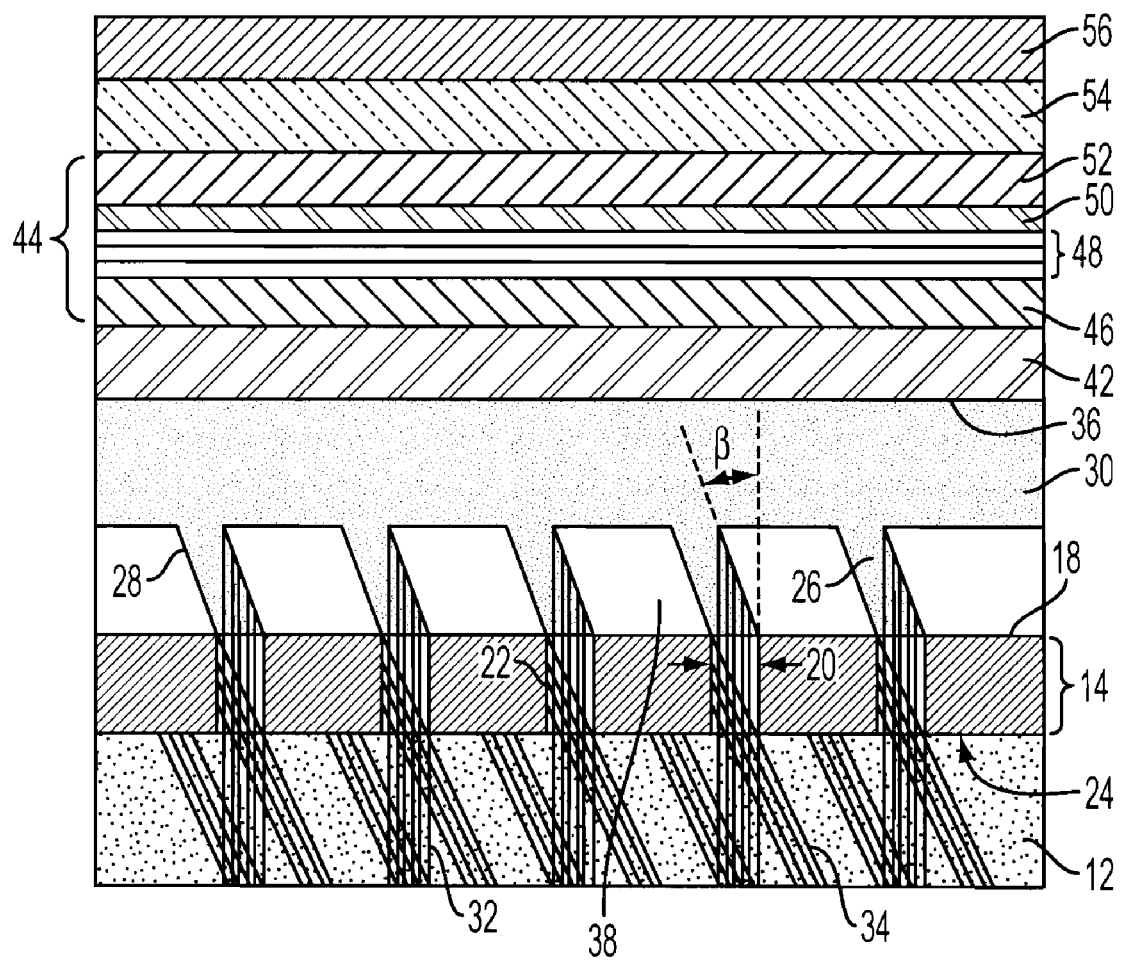
FIG. 2 is a cross-sectional view of the structure of FIG. 1, with additional layers formed thereon to thereby form a solid-state laser diode according to one embodiment of the present disclosure.

With reference next to FIG. 2, an aluminum gallium nitride (AlGaN) lower cladding layer 42 is formed over surface 36, for example within the MOCVD chamber. Layer 42 is a relatively thick layer, for example 0.9-2.0 μm or thicker. Layer 42 exhibits a relaxed lattice structure due to formation of an array of misfit dislocations (MD) over coalescence layer 30, allowing that layer to be grown to such thicknesses without cracking or related structural damage. Layer 42 provides improved mode confinement as compared, for example, to known SPSL lower cladding structures, particularly for longer wavelength devices.

A device core 44 is next formed over layer 42. Device core 44 comprises an undoped or lightly n-doped $In_xGa_{1-x}N$ ($0 \leq x \leq 0.1$ and $n \leq 5 \times 10^{17}$ cm$^{-3}$) lower waveguide layer 46, active region 48, a p-doped $Al_xGa_{1-x}N$ ($0 \leq x \leq 0.1$ and $p \approx 2 \times 10^{18}$ cm$^{-3}$) electron blocking layer (EBL) 50, and p-doped GaN (typically $p \leq 2 \times 10^{18}$ cm$^{-3}$) upper waveguide layer 52. Lower waveguide layer 46 and upper waveguide layer 52 are each about 100-200 nm thick. The electron blocking layer 50 typically has an Al-content of 15-25%, and a thickness of about 10-30 nm.

Figure 3:
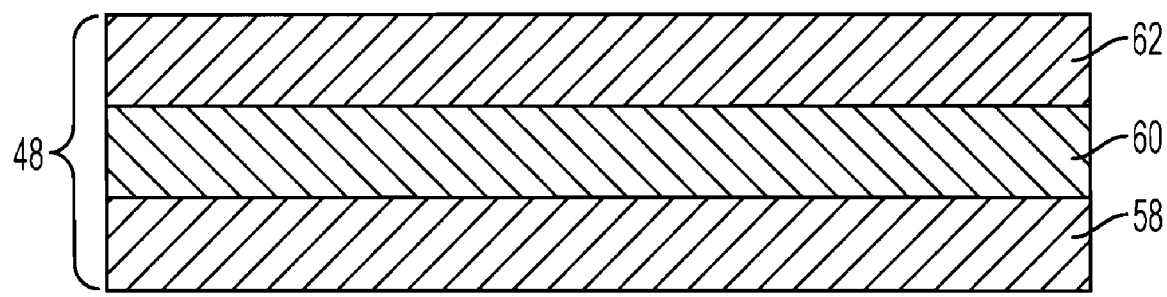
FIG. 3 is cross-sectional view of an active region of a type employed in solid state light emitting devices according to various embodiments of the present disclosure.

According to one embodiment of the present disclosure shown in FIG. 3, active region 48 comprises: a lower active layer 58 comprising indium gallium nitride in the proportion of $In_xGa_{1-x}N$, where $0 \leq x \leq 0.05$; a middle active layer 60 comprising indium gallium nitride in the proportion of $In_yGa_{1-y}N$, where $0.1 \leq y \leq 0.3$; and an upper active layer 62 comprising indium gallium nitride in the proportion of $In_zGa_{1-z}N$, where $0 \leq z \leq 0.05$. Importantly, in this embodiment at least middle active layer 60 does not exhibit a relaxed lattice structure (no MD) so that the current required for stimulated emission of photons therein is minimized. While such a structure provides a single quantum well active region, multiple quantum active regions may also be employed, for example by repeating active region 48 two or more times, or by providing additional different quantum well structures (not shown) over or under region 48, as will be appreciated by one skilled in the art.

Returning to FIG. 2, formed over device core 44 is upper cladding region 54, which in one embodiment comprises a p-type 2.5 nm $Al_{0.1-0.2}Ga_{0.9-0.8}N$/2.5 nm GaN short-period super-lattice (SPSL). While upper cladding region 54 may comprise an SPSL, other structures and arrangements can alternatively be utilized. Finally, contact layer 56, for example p-type GaN, is formed over upper cladding region 54.

Figure 7:
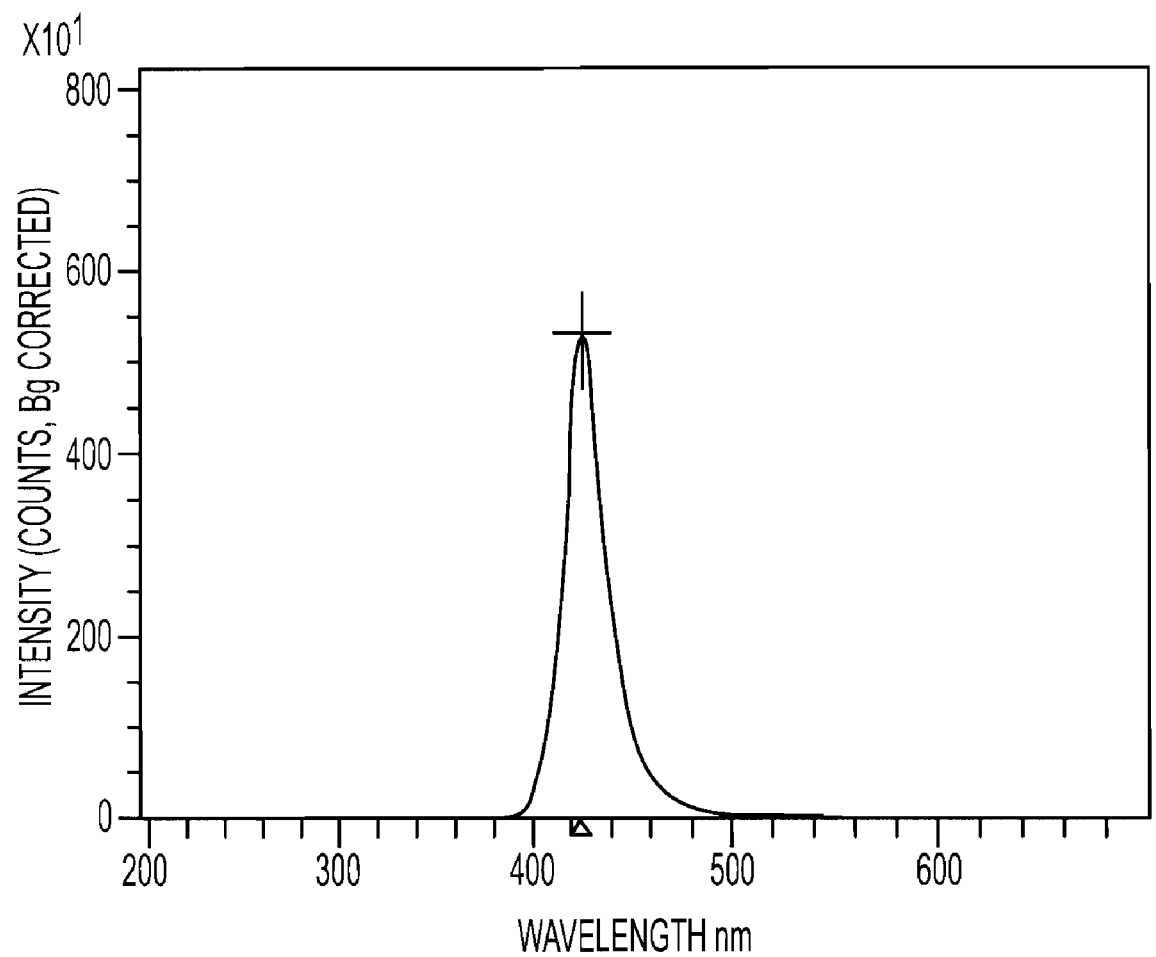
FIG. 7 is a plot of wavelength versus spot intensity for a device of the type shown in and described with regard to FIG. 2.

FIG. 7 is a plot of wavelength versus spot intensity for a device of the type described above. In this case, the device was a dual quantum well device, with two substantially similar active regions 48 one atop the other. As can be seen, the device exhibited peak optical intensity at approximately 424 nm, in the blue portion of the visible spectrum. Other wavelengths may be provided through different choices of materials for the quantum well and other various layers of the device.

Figure 4:
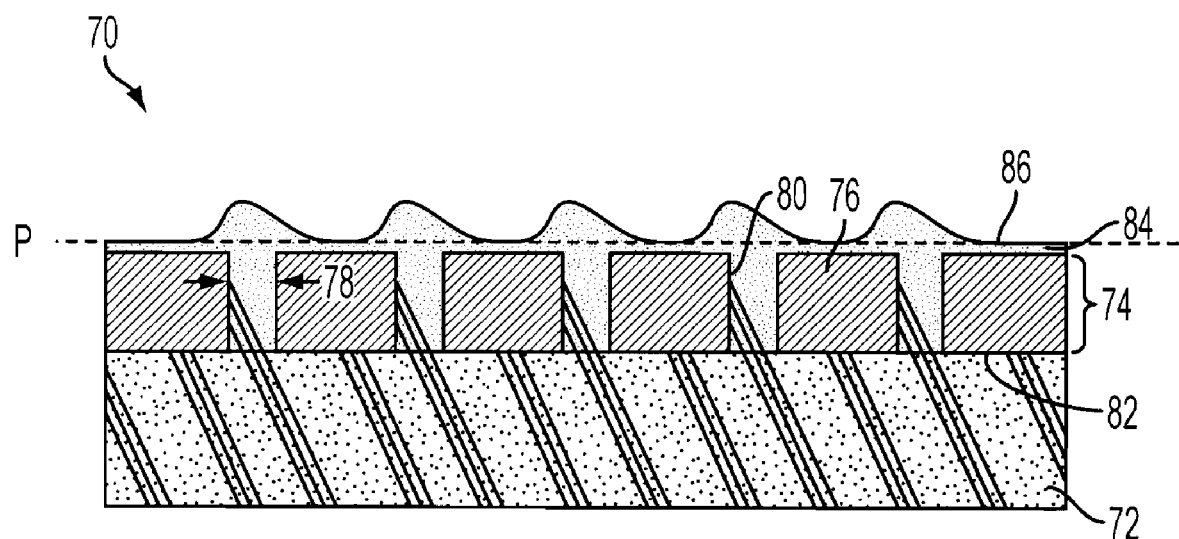
FIG. 4 is a cross-sectional view of a structure with lattice defect suppressing islands, but without inclined posts, according to another embodiment of the present disclosure.
Figure 8:
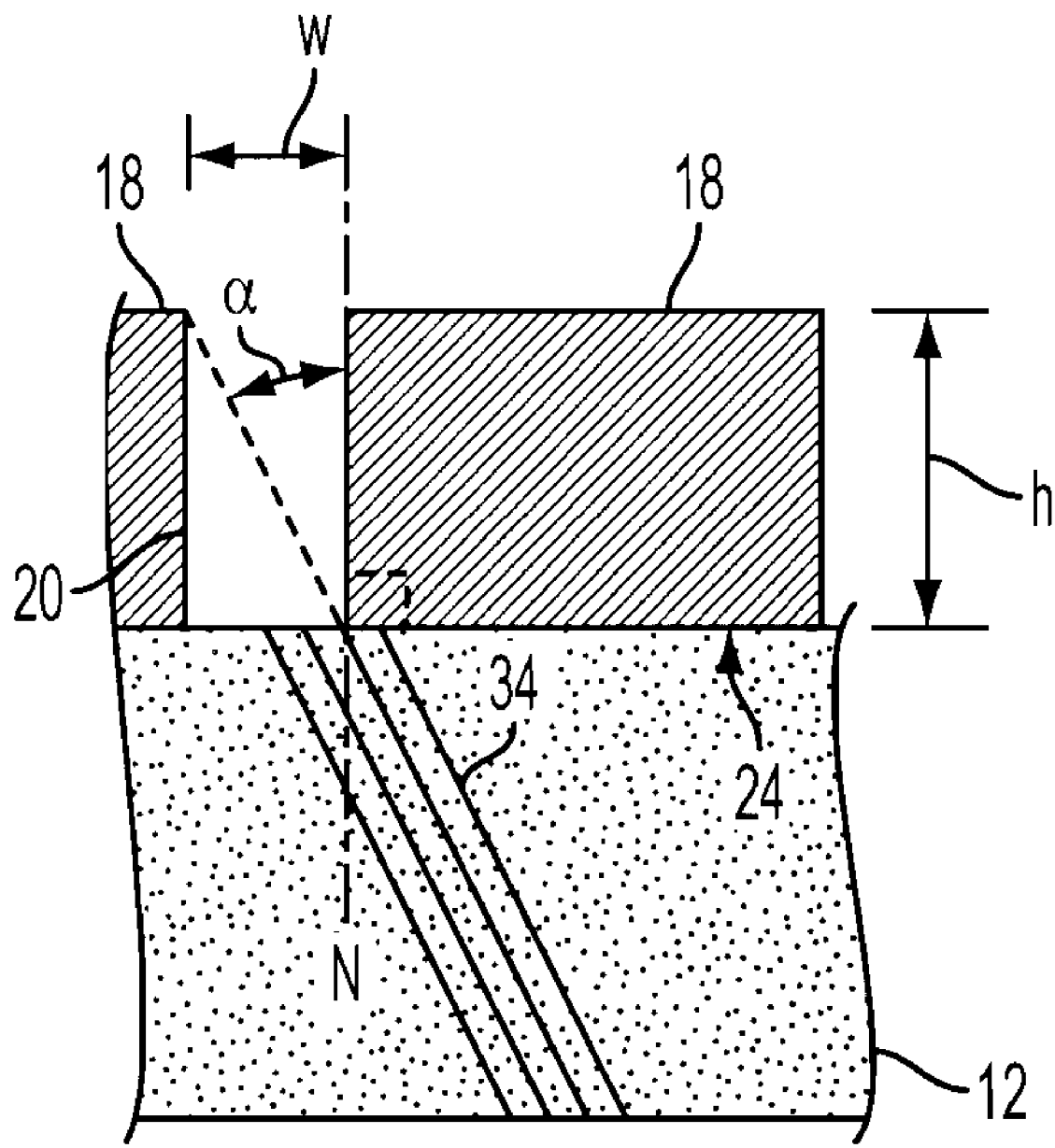
FIG. 8 is a cross section view of a portion of a light emitting structure illustrating orientation of a template such that its primary crystallographic plane is inclined at an angle α which is out of normal to a growth plane of said template.

According to one variation of the above-described embodiment, in place of posts formed to address multiple-plane dislocation defects, when dislocation defects are present in a single plane other than parallel to the normal of the growth surface, GaN growth within channels may be employed. Such a structure 70 is illustrated and described with reference to FIGS. 4 and 5. A template 72, which may be a 1 micron thick or thicker nitride layer (e.g., GaN) of semi-polar orientation (e.g., other than (0001) or ($10\overline{1}0$) oriented surface) grown by MOCVD (or any suitable method) on sapphire or any other suitable substrate (not shown). In the case of wurtzitic nitride substrates, template 72 has a growth plane corresponding to a crystallographic plane forming an angle α other than 0 or 90 degrees to its primary crystallographic plane. For other crystallographic substrate materials, template 72 is oriented such that its primary crystallographic plane is at an angle α that is out of normal to said growth plane. FIG. 8 illustrates angle α relative to the planes of the sidewalls of windows 20 and growth surface 24.

Returning to FIG. 4, a dielectric layer 74, for example $SiO_2$ approximately 2 microns thick, is deposited on template 72. Dielectric layer 74 is next patterned, for example by masking and etching, to thereby define islands 76 and windows 78. Islands 76 define sidewalls 80 predominantly in the direction perpendicular to a growth surface 82 of the wurtzite unit cell.

The substrate is then placed into a MOCVD growth chamber and heated to 1050° C. in an ammonia atmosphere, and a GaN layer is formed, first within windows 78, then when windows 78 are filled both vertically and laterally over the upper surface of islands 76. Growth continues until coalescence is achieved, thereby forming layer 84.

At this point, the upper surface 86 of layer 84 may not be smooth. Indeed, due to the geometry, growth over windows 78, portions of layer 84 may be thicker thereover, which require polishing in order to render upper surface 86 planar. As much as 1000-3000 nm of material may be required to be removed in order to render upper surface 86 planar. Thus, as a next step in the process, upper surface 86 of layer 84 is polished into a desired plane p.

Figure 5:
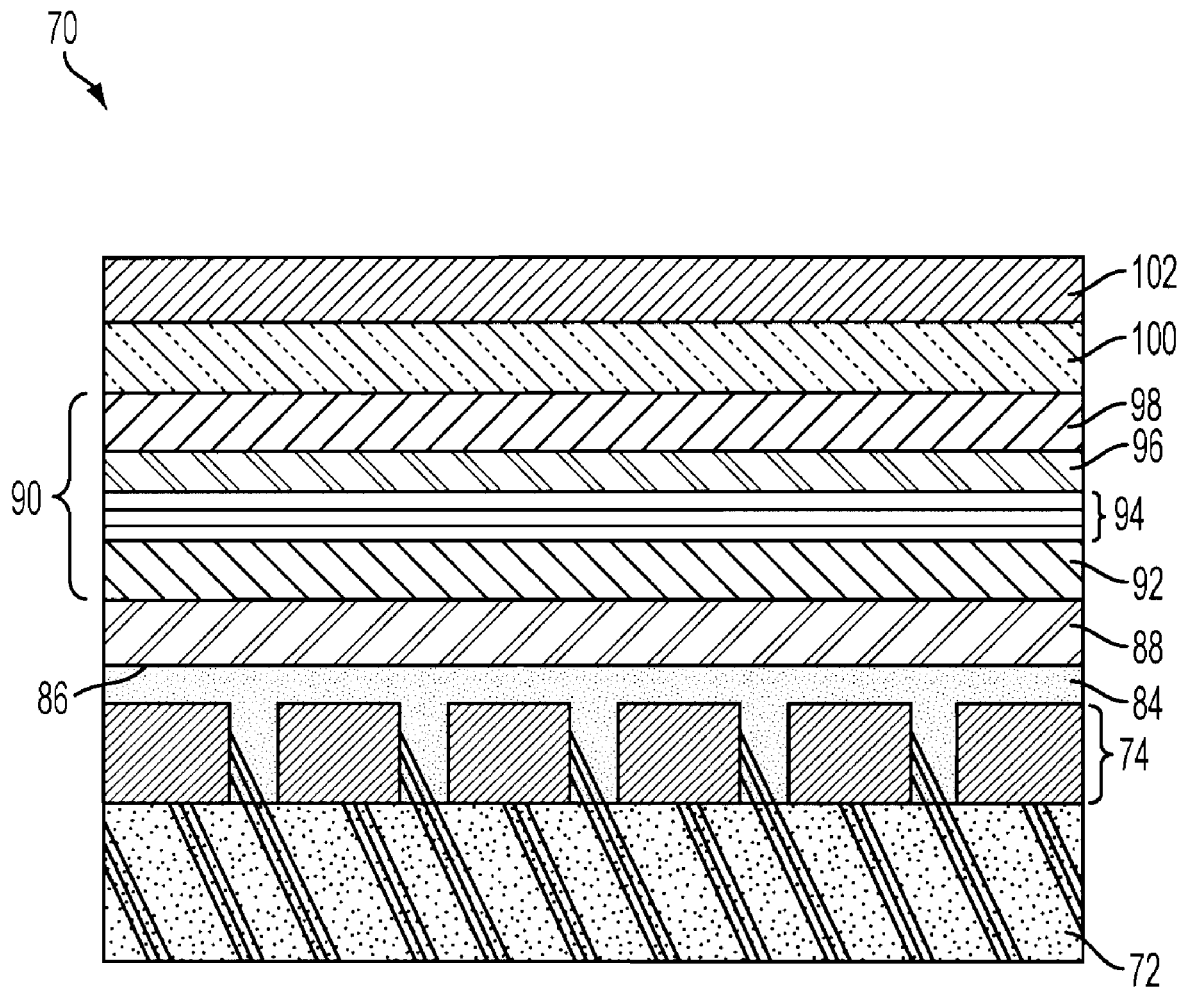
FIG. 5 is a cross-sectional view of the structure of FIG. 4, with additional layers formed thereon to thereby form a solid-state laser diode according to one embodiment of the present disclosure.

With reference next to FIG. 5, as previously described, an aluminum gallium nitride (AlGaN) lower cladding layer 88 is formed over surface 86. Layer 88 is a relatively thick layer, for example 0.9-2.0 μm or thicker, exhibiting a relaxed lattice structure due to misfit dislocations (MD) over GaN layer 84, allowing that layer to be grown to such thicknesses without cracking or related structural damage.

A device core 90 is next formed over layer 88. Device core 90 comprises n-GaN lower waveguide layer 92, active region 94, electron blocking layer (EBL) 96, and upper p-GaN upper waveguide layer 98. Active region 94 comprises: indium gallium nitride in the proportion of $In_xGa_{1-x}N$/indium gallium nitride in the proportion of $In_yGa_{1-y}N$/indium gallium nitride in the proportion of $In_zGa_{1-z}N$, where $0 \leq x \leq 0.05$, $0.1 \leq y \leq 0.3$, and $0 \leq z \leq 0.05$. Again, while such a structure provides a single quantum well active region, multiple quantum active regions may also be employed. Formed over device core 90 is upper cladding region 100, which in one embodiment comprises a p-type short-period super-lattice (SPSL), similar to that described above. Finally, contact layer 102, for example p-type GaN, is formed over upper cladding region 100.

Figure 6:
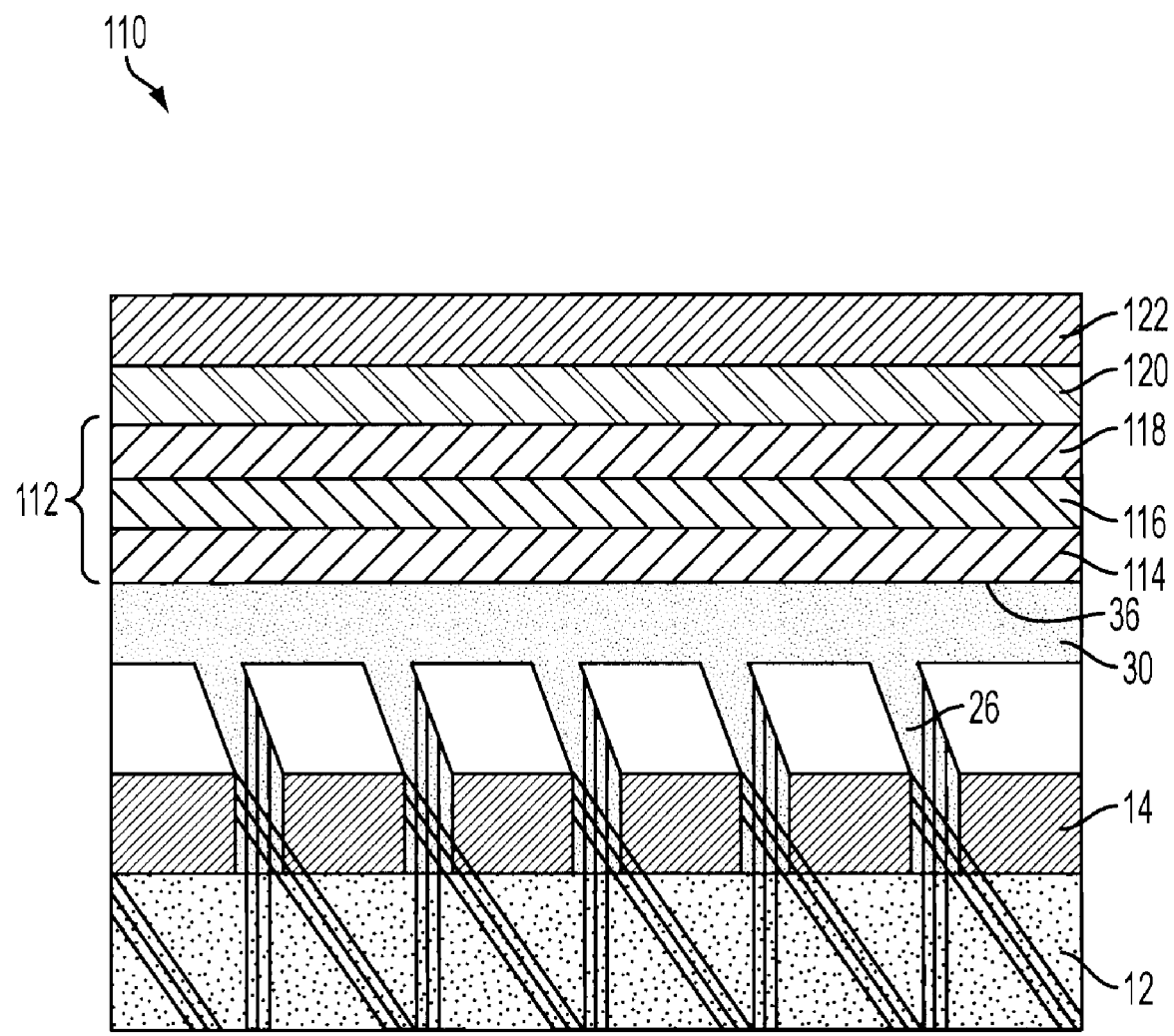
FIG. 6 is a cross-sectional view of the structure of FIG. 1, with additional layers formed thereon to thereby form a solid-state light-emitting diode according to one embodiment of the present disclosure.

The present disclosure is equally applicable to a solid-state pn-junction light emitting diode (LED), as shown in and described with reference to FIG. 6. The process producing an LED proceeds as shown and described above with regard to FIG. 1. That is, a coalesced series of posts are formed, and the coalesced surface above the posts is polished to a desired roughness and presented as a growth surface. Yet another alternative is to employ the island and window structure shown and described above with regard to FIG. 4. We describe the process of producing an LED assuming use of the posts and coalesced surface of FIG. 1, but such is not the sole starting point, and thus should not be interpreted as limiting the scope of the disclosure or claims relating to forming an LED.

Accordingly, active region 112 is formed over the polished upper surface 36 of coalescence layer 30. Active region 112 comprises: a lower active layer 114 comprising indium gallium nitride in the proportion of $In_xGa_{1-x}N$; a middle active layer 116 comprising indium gallium nitride in the proportion of $In_yGa_{1-y}N$; and an upper active layer 118 comprising indium gallium nitride in the proportion of $In_zGa_{1-z}N$; where $0 \leq x \leq 0.05$, $0.1 \leq y \leq 0.3$, and $0 \leq z \leq 0.05$. Again, while such a structure provides a single quantum well active region, multiple quantum active regions may also be employed. EBL layer 120 is formed over active region 112. Finally, contact layer 122, for example p-type GaN, is formed over EBL layer 120.

During subsequent steps of processing into final LED and LD devices, mesas (not shown) may be formed on the epitaxial surface 36 with sidewalls extending below the ELOG base structure thereby exposing voids 38 that are formed during the lateral overgrowth.

In some device geometries, it is desirable to flip-chip the device with its p-metallization down, bonded onto a carrier heat sink such as a copper block using known soldering techniques. The substrate and template structure may be removed either by using an excimer laser to decompose the GaN/sapphire interface (laser lift-off) or by supplying suitable chemical agents such as potassium hydroxide (KOH) to the ELOG base region where parts or all of the posts are dissolved and thereby the connection to the substrate is broken.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art, which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A solid-state light emitting structure, comprising:
   a template structure having a growth surface defining a growth plane, said template oriented such that its primary crystallographic plane is oriented at an angle α that is out of normal to said growth plane;
   a dielectric layer over and in physical contact with said template structure, said dielectric layer having a plurality of windows formed there, each said window having a structural sidewall over at least a portion of said growth surface and extending substantially normal to said growth plane and defining a plurality of window openings, said window openings having a width, w, and a height, h;
   a coalescence layer over and in physical contact with said dielectric layer, said coalescence layer including portions extending within said window openings, such that crystallographic defects which originate at a portion of said growth surface and which lie in planes that are substantially parallel to said crystallographic plane of said template substantially terminate at said sidewalls and thereby substantially do not extend beyond the height h of said window openings, said coalescence layer having a substantially planar, continuous, polished upper surface;
   an active region over said coalescence layer, said active region comprising:
      a lower active layer of indium gallium nitride in the proportion of $In_xGa_{1-x}N$, where $0 \leq x \leq 0.05$;
      a middle active layer of indium gallium nitride in the proportion of $In_yGa_{1-y}N$, where $0.1 \leq y \leq 0.5$; and,
      an upper active layer of indium gallium nitride in the proportion of $In_zGa_{1-z}N$, where $0 \leq z \leq 0.05$; and
   a contact layer over said active region.

2. The solid-state light emitting structure of claim 1, wherein said coalescence layer comprises post structures over said window openings, said post structures:

have a height h over said growth surface;
have sidewall facets; and
are inclined at an angle, β, relative to said growth plane and out of normal to said growth plane;
whereby, crystallographic defects which originate at a portion of said growth surface and have an orientation substantially normal to said crystallographic plane substantially terminate at said facets and thereby substantially do not extend beyond the height h of said post structures.

3. The solid-state light emitting structure of claim 1, further comprising:
an n-type aluminum gallium nitride layer disposed over and in physical contact with said upper surface of said coalescence layer and disposed below said active region, said aluminum gallium nitride layer exhibiting a relaxed lattice structure due to misfit dislocations over said coalescence layer.

4. The solid-state light emitting structure of claim 3, wherein said aluminum gallium nitride layer has a thickness in the range of 0.9-2.0 micrometers.

5. The solid-state light emitting structure of claim 3, wherein said aluminum gallium nitride cladding layer comprises a superlattice structure comprising at least one layer pair of aluminum gallium nitride layers.

6. The solid-state light emitting structure of claim 1, wherein said coalescence layer is formed of a material selected from the group consisting of: gallium nitride, aluminum gallium nitride, and indium gallium nitride.

7. The solid-state light emitting structure of claim 1, further comprising:
an n-type lower gallium nitride waveguide layer disposed in between and in physical contact with each of said aluminum gallium nitride layer and said active region;
an electron blocking layer over and in physical contact with said active region;
a p-type upper gallium nitride waveguide layer disposed over and in physical contact with said electron blocking layer;
a p-type short-period super-lattice cladding structure disposed over and in physical contact with said p-type upper gallium nitride waveguide layer; and
a gallium nitride contact layer disposed over and in physical contact with said p-type short-period super-lattice cladding structure.

* * * * *